United States Patent [19]

Ferraris et al.

[11] Patent Number: 5,152,869
[45] Date of Patent: Oct. 6, 1992

[54] PROCESS FOR OBTAINING PASSIVE THIN-LAYER CIRCUITS WITH RESISTIVE LINES HAVING DIFFERENT LAYER RESISTANCES AND PASSIVE CIRCUIT MADE BY SAID PROCESS

[75] Inventors: Giampiero Ferraris, Monticello; Antonio Tersalvi, Milan, both of Italy

[73] Assignee: Siemens Telecommunicazioni S.p.A., Milan, Italy

[21] Appl. No.: 627,568

[22] Filed: Dec. 11, 1990

Related U.S. Application Data

[63] Continuation-in-part of Ser. No. 64,147, Jun. 18, 1987, abandoned.

[30] Foreign Application Priority Data

Jul. 15, 1986 [IT] Italy ................................ 21126 A/86

[51] Int. Cl.⁵ .................... B05D 5/12; H01C 17/06
[52] U.S. Cl. .................... 156/652; 156/656; 156/659.1; 29/610.1; 29/620
[58] Field of Search .............. 437/189, 190, 192, 203; 148/DIG. 136; 156/656, 652, 659.1; 29/620, 610.1; 338/308, 314, 195

[56] References Cited

U.S. PATENT DOCUMENTS

| | | | |
|---|---|---|---|
| 3,423,821 | 1/1969 | Nishimura | 148/DIG. 136 |
| 4,112,196 | 9/1978 | Selig et al. | 437/182 X |
| 4,226,932 | 10/1980 | Ferraris . | |
| 4,743,953 | 5/1988 | Toyokura et al. | 357/23.11 X |
| 4,801,469 | 1/1989 | Norwood | 29/620 X |

FOREIGN PATENT DOCUMENTS 0256568 10/1988 European Pat. Off. .
3200983 7/1983 Fed. Rep. of Germany .

OTHER PUBLICATIONS

European Search Report EP 87 20 1179.
Navy Technical Disclosure Bulletin, vol. 8, No. 4, Jun. 1983, pp. 83–86, Washington, US; H. Morris: "A Dual Resistivity Thin Film Hybrid Microcircuit".
Patent Abstracts of Japan, vol. 5, No. 34 (E-48) (706) 4th Mar. 1981; and JP-A-55 162 254 (Nippon Denki K.K.) Dec. 17, 1980.
Norwood, "A New Multiple Sheet Resistance Technology for Thin Film Circuits", Sandia National Lab., pp. 281–286.
Misiano et al., "Etch Sputtering for Realization of I.C. and M.I.C. with . . . Resistors", pp. 183–187.

*Primary Examiner*—Thi Dang
*Attorney, Agent, or Firm*—Adel A. Ahmed; Jeffrey P. Morris

[57] ABSTRACT

A process on a single insulating substrate for depositing in succession a thin layer of tantalum with high resistivity doped with nitrogen and oxygen, a less thin layer of titanium with low resistivity doped with nitrogen, a layer of palladium and a thick layer of gold. Selective chemical attacks of said layers then permit tracing of conducting lines, resistive lines with greater resistance and resistive lines with less resistance.

6 Claims, 4 Drawing Sheets

PROCESS FOR OBTAINING PASSIVE THIN-LAYER CIRCUITS WITH RESISTIVE LINES HAVING DIFFERENT LAYER RESISTANCES AND PASSIVE CIRCUIT MADE BY SAID PROCESS

CROSS-REFERENCE TO RELATED APPLICATION

This is a continuation-in-part of U.S. Pat. Ser. No. 07/064,147 filed Jun. 18, 1987, now abandoned.

BACKGROUND OF THE INVENTION

1. Field of the Invention

The present invention relates to a process for obtaining thin-layer passive circuits with resistive lines of different layer resistances as well as the passive circuit made by such a process.

2. Description of the Prior Art

There is a known need for producing on the same substrate of a passive thing-layer circuit two different types of resistive lines having different layer resistances.

Recent techniques teach producing resistive lines having greater and lesser resistivity by superimposing on the thin layers an additional layer of a second material having less resistivity.

In accordance with a first known technique the material with greater resistivity is a ceramic-metal alloy (CERMET) and the material with less resistivity is a nickel-chromium alloy.

In accordance with another known technique the material with less resistivity is a titanium-palladium alloy and the material with greater resistivity is tantalium nitride ($Ta_2N$).

An example of the last-mentioned technique is described in the article entitled: "A NEW MULTIPLE SHEET RESISTANCE TECHNOLOGY FOR THIN FILM CIRCUITS", by David Norwood, Proceedings of the 1985 International Symposium on Microelectronics—Anaheim, Calif., U.S.A. 11-14 Nov. 1985, pp. 281-286.

This article teaches a variant, applied to the standard process of $Ta_2N$ thin film resistor manufacturing, consisting of an additional photoprocessing step to obtain lower value resistors from titanium and palladium layers (TiPd resistors); e.g. in line 2 of abstract, and in column 2 of page 282.

The main drawback of this process, as is explicitly admitted in the article, is that the manufactured TiPd resistors exhibit, within the range of utilization, an excessively high temperature coefficient (TCR) and poor temperature stability of the TCR, as shown in FIGS. 8 and 9, on page 285 thereof. The temperature sensitivity of the TiPd low value resistors is mainly due to the palladium layer, as this element has a TCR of 3770 PPM per degree Celsius (PPM/°C.) in its elemental forms; however the Ti and $Ta_2N$ underlayers reduce the TCR to some extent.

This higher TCR appears to be the limiting factor in using this process.

A second drawback of Norwood's process is that the TiPd resistors obtained have a positive TCR while the $Ta_2N$ resistors have a negative TCR; consequently the temperature variation amplifies the value of the resistive gap between the two types of resistor.

Both of the above described prior art techniques have the drawback of requiring very complicated, long and costly production processes. In particular, they require a photoengraving step after deposit of the first material.

The object of the present invention is to provide a passive thin-layer circuit with resistive lines having different layer resistances by a simpler, more rapid and economical process more profitable than processes in accordance with prior art techniques.

SUMMARY OF THE INVENTION

In accordance with the present invention a process is described that uses for the greater resistivity lower layers, tantalum treated with a first dopant and for the lesser resistivity upper layers, titanium treated with a second dopant.

In this manner two materials compatible with titanium can be superimposed and then, being doped differently, subjected to selective chemical etching to accomplish, depending on the case, single-layer resistive lines having greater resistance and double-layer resistive lines having less resistance.

Another aspect of the process in accordance with the present invention is that on the titanium layer is superimposed by a thin layer of palladium which acts as a barrier against spreading of the titanium into the conductive layers subsequently superimposed.

In this manner the titanium can act as an adhesive layer for the conductive layers without giving rise to undesired spreading problems.

In accordance with another aspect of the invention, the process in accordance with the present invention eliminates the aforementioned resistor manufacturing drawbacks. In accordance with the present invention, TiN is utilized as a lower resistivity-value layer, allowing selective chemical etching of the Palladium which is the main cause of TCR problems.

In accordance with a further aspect of the invention, another advantage related to the use of TiN is that it has a negative TCR value of about $-150$ PPM/°C. and therefore of the same sign as that of the Ta-O-N TCR value, which is about $-390$ PPM/°C. Consequently the resistors, both of higher and lower value, manufactured with the process in accordance with the present invention, exhibit a lower TCR value that is also very stable with temperature.

The details of the process in accordance with the present invention are described with reference to the drawings wherein:

DESCRIPTION OF THE PREFERRED EMBODIMENT

Figure 1:
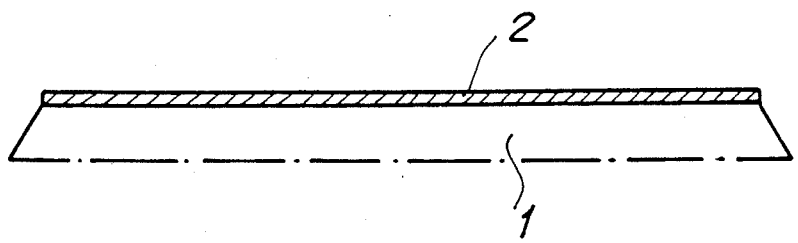

As shown in FIG. 1 on an insulating substrate 1 (aluminum, quartz, glass) is initially deposited by cathodic pulverization in a vacuum a layer of tantalum 2 doped with nitrogen and oxygen (i.e. tantalum oxynitride Ta-O-N) having a resistivity of 350–450 $\mu$ohm.cm and a thickness of approximately 300Å.

Figure 2:
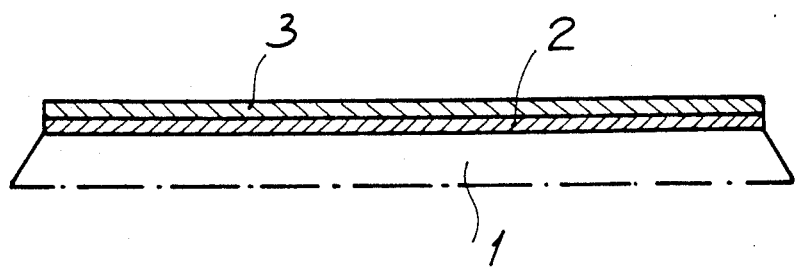

As shown in FIG. 2, in the same vacuum cycle is then superimposed by cathodic pulverization in a vacuum a layer of titanium 3 doped with nitrogen (i.e. titanium nitride TiN) having a resistivity of 200–250 $\mu$ohm.cm and a thickness of approximately 1000Å.

Figure 3:
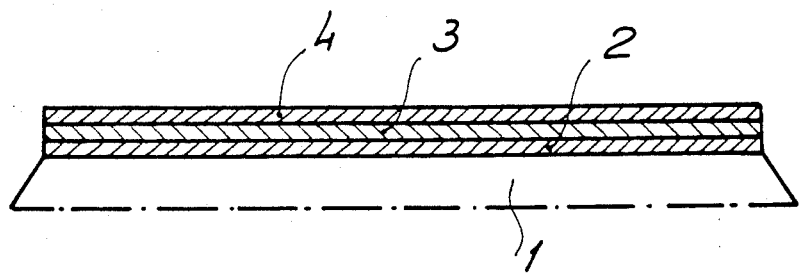

As shown in FIG. 3, in the same vacuum cycle again is also superimposed by cathodic pulverization in a vacuum a layer of palladium 4 with the function of a barrier against spreading in relation to the underlying layer of titanium 3.

Figure 4:
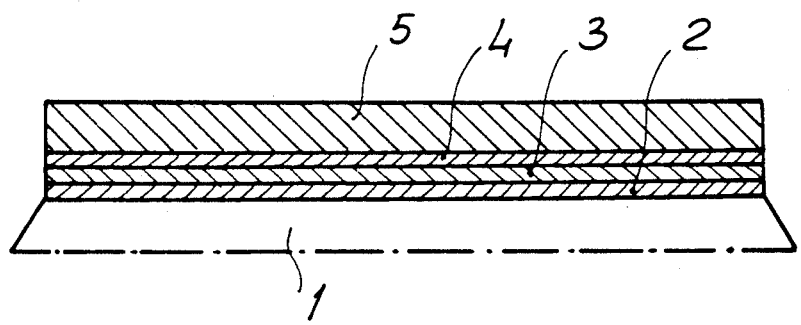
Figure 5:
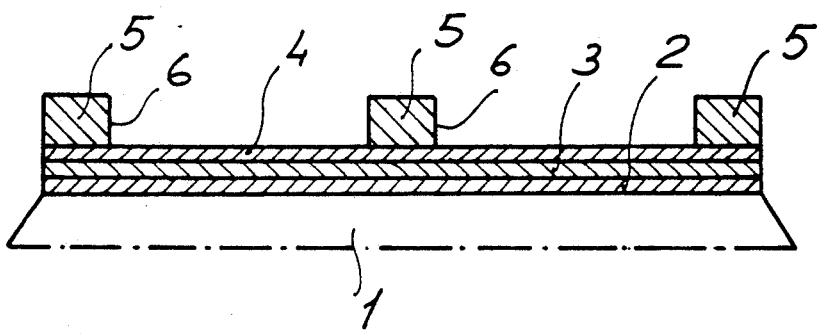

As shown in FIG. 4, on the structure thus formed is superimposed a thick layer of photoresist 5 in which for exposing and developing are subsequently made windows 6 at the zones designed to receive the conductors, as shown in FIG. 5.

Figure 6:
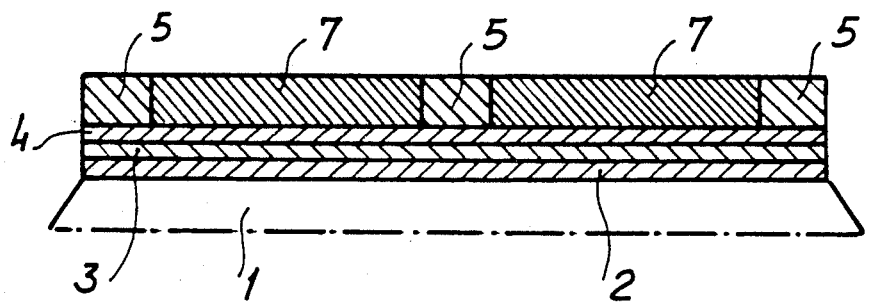

As shown in FIG. 6, after washing of the areas of the windows 6 and drying of the photoresist 5 in an oven in the above-described areas, gold is electrodeposited so as to form conducting lines 7.

Figure 7:
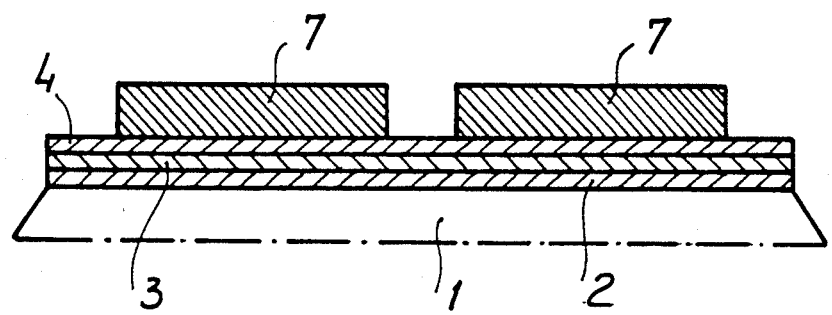
Figure 8:
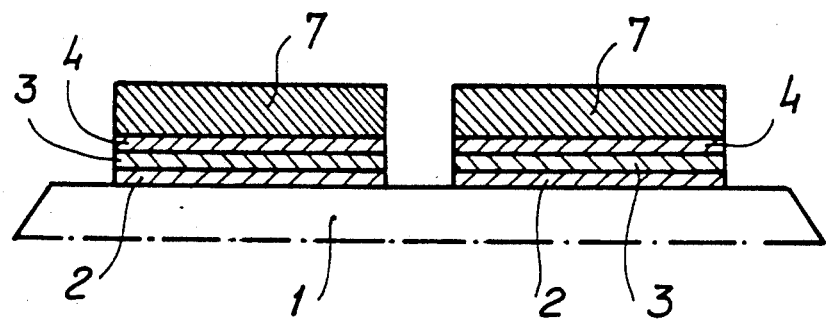

Referring to FIG. 7, the layer of photoresist 5 is then removed to allow subsequent removal by chemical etching of the palladium 4, titanium nitride 3 and tantalium oxynitride 2 from the areas which are not protected by the conducting lines 7. This can be seen with reference also to FIG. 8.

Figure 9:
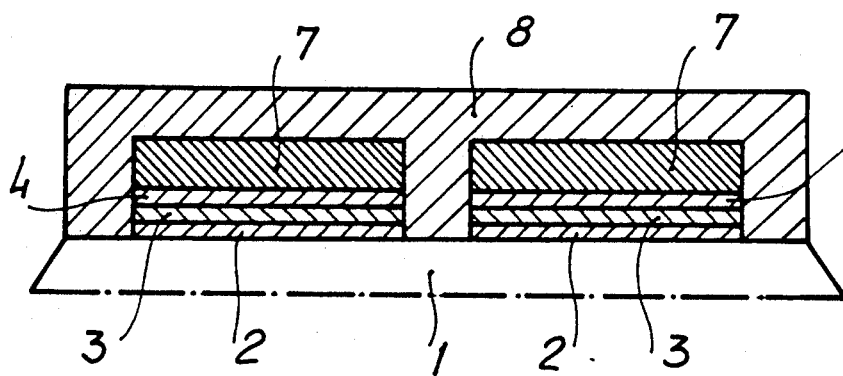
Figure 10:
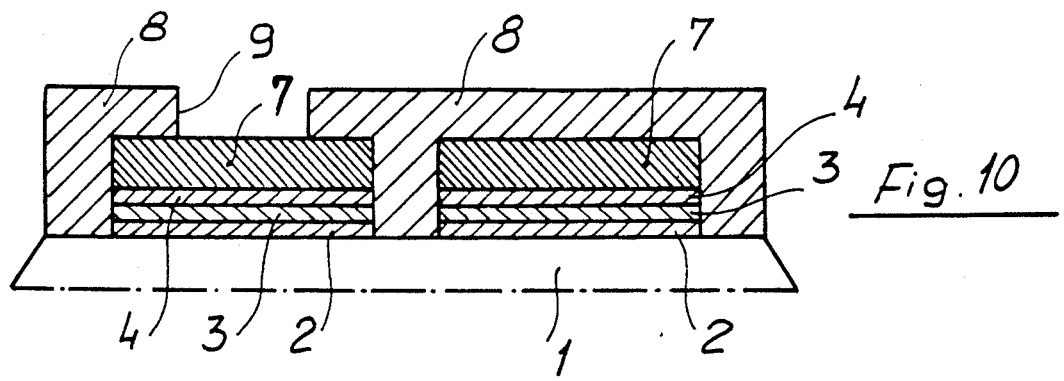

The structure thus obtained, can be seen with reference to FIG. 9, is completely covered with a thick layer of photoresist 8, in which by exposing and developing are then created windows 3, as shown in FIG. 10, to uncover the zones of the conductors 7 which are to be etched chemically to obtain the resistive lines having greater resistivity.

Figure 11:
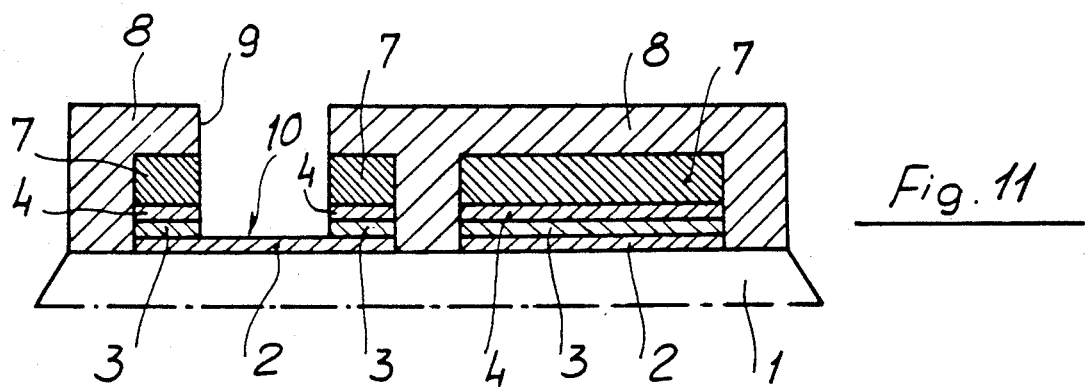

This operation is subsequently performed by selective chemical etching of the layers of gold 7, palladium 4 and titanium 3 in the uncovered areas while the underlying layer of tantalium 2 being doped differently resists the etching and thus forms resistive lines 10 with resistivity of between 350 and 450 $\mu$ohm.cm and thickness of approximately 300Å. The foregoing is illustrated at FIG. 11.

Figure 12:
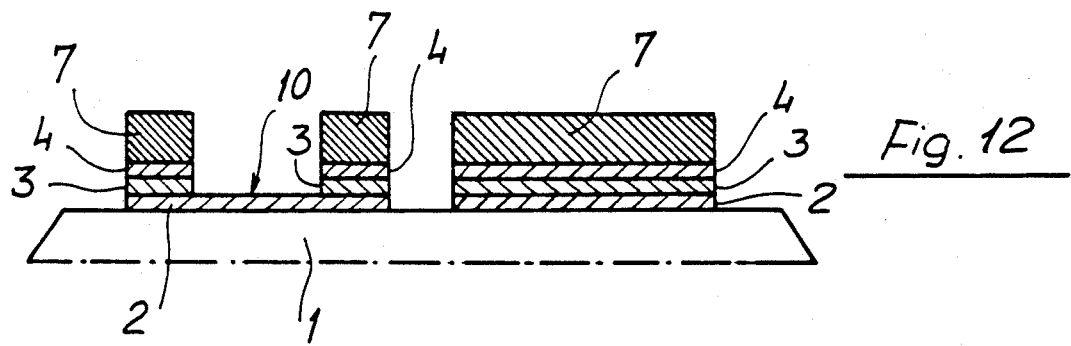
Figure 13:
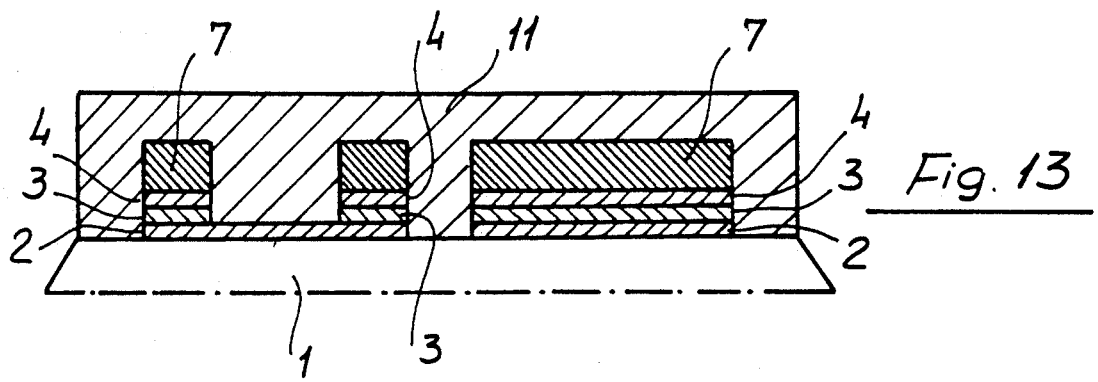
Figure 14:
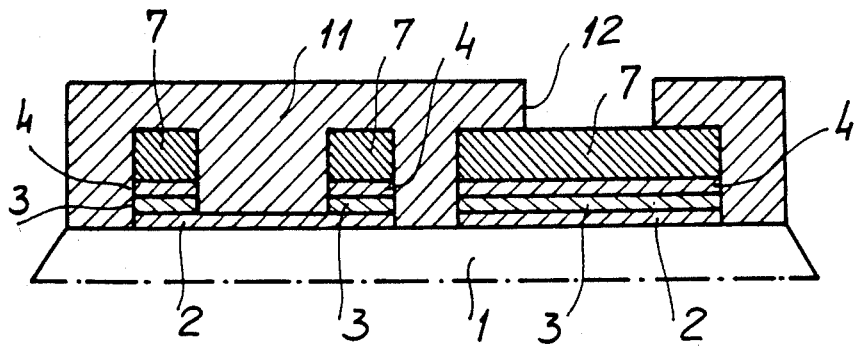

The residual layer of photoresist 8 is removed, as shown by FIG. 12, and replaced with a new thick layer of photoresist 11, as shown by FIG. 13, in which are created by exposition and development windows 12, shown with reference to FIG. 14 which coincide with the areas intended for formation of the resistive lines of less resistivity.

Figure 15:
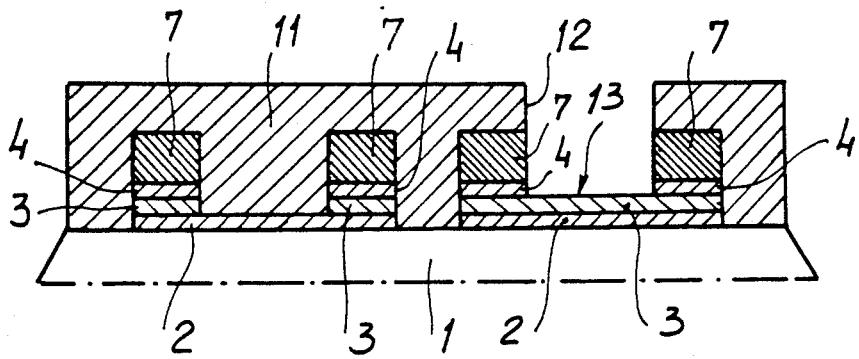

In these areas selective chemical etching removes the layers of gold 7 and palladium 4 leaving unchanged the superimposed layers of titanium 3 and tantalium 2 which form resistive lines 13 having resistivity between 200 and 250 $\mu$ohm.cm and thickness of approximately 1000Å. This is illustrated at FIG. 15.

Figure 16:
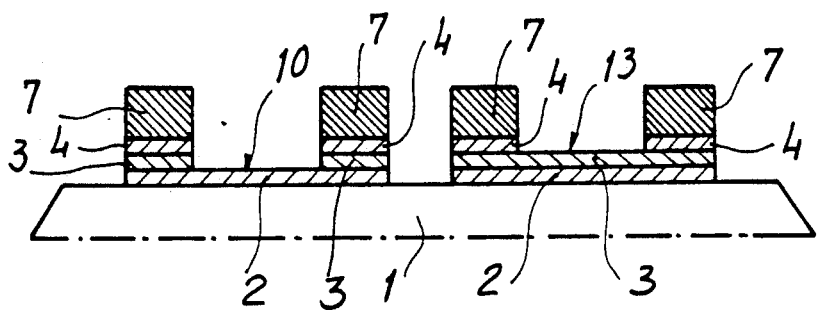
Figure 17:
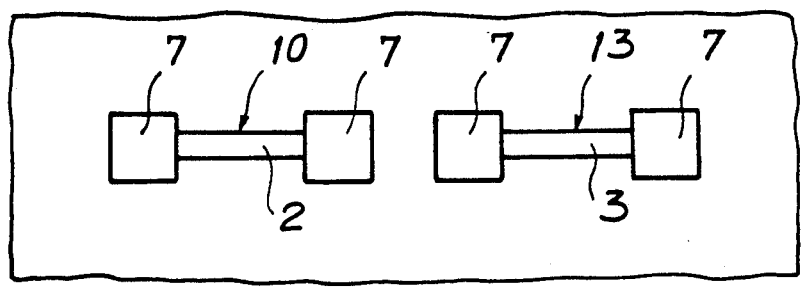

The photoresist 11 is subsequently removed so as to uncover the final structure shown in FIGS. 16 and 17, i.e. a passive circuit consisting of an insulating substrate 1, and conducting line 7 and resistive lines 10 and 13 which have greater and lesser resistance respectively.

The circuit is finally subjected to cleaning and stabilization of the resistors 10 and 13 by oxidation of the layers at 300-340° C. in a circulating air oven.

The principal benefits of the process in accordance with the present invention and of the circuit produced thereby can be summarized as follows: (1) the titanium and the tantalium are compatible materials which can remain in contact and being doped differently are also selective in relation to chemical etching so as to allow removal when and where desired of only the titanium for formation of the resistive lines having greater resistance, (2) the titanium acts as an adhesive layer between the two resistive layers and the superimposed conductive layer and at the same time the palladium acts as a barrier to prevent spreading of the titanium into the gold of the conductors, (3) the various resistive layers are deposited by cathodic pulverization in a single vacuum cycle and the speed of the basic metallization is therefore very high, and (4) the process is generally very simple and rapid and in particular to two resistive layers are obtained by the addition of a single photoengraving step to the standard cycle used for obtaining passive thin layer circuits by nitride and tantalum technology. This means the materials and equipment already available can be used more efficiently.

What is claimed is:

1. A process for obtaining passive thin-layer circuits with resistive lines having a proper layout and a different layer resistance formed by the steps of:

laying a first high resistivity layer made of tantalum treated with a first dopant of nitrogen and oxygen on an insulator substrate;

superimposing a second low resistivity layer made of titanium treated with a second dopant of nitrogen to said first layer;

superimposing to said second layer a third layer made of palladium having barrier function against diffusion of titanium to said second layer;

superimposing to said third layer a fourth layer made of high conductivity metal to form conducting lines on said third layer;

removing said first, second, third and fourth layer outside the layout of said resistive lines having different resistance; such that the resistive lines having high resistivity are obtained by the substep of a first selective removal of said fourth, third and second layer effected in correspondence with the layout of said resistive lines having high resistivity; and such that the resistive lines having low resistivity are obtained by the further substep of a second selective removal of said fourth and third layer effected in correspondence with the layout of said resistive lines having low resistivity.

2. A process in accordance with claim 1 wherein said first, second and third layer are obtained by cathodic pulverization in vacuum.

3. A process in accordance with claim 1 wherein the removing of said layers is by means of a respective resist deposit and photomasking process.

4. A process in accordance with claim 1 wherein said first and second selective removals are obtained by means of a respective first and second chemical etching.

5. A process in accordance with claim 2 wherein said first, second and third layers are superimposed in a same vacuum cycle.

6. A process in accordance with claim 2 wherein said high conductivity metal is gold.

* * * * *